(12) United States Patent
Mihajlovic et al.

(10) Patent No.: US 11,968,907 B2
(45) Date of Patent: Apr. 23, 2024

(54) MAGNETORESISTIVE MEMORY DEVICE INCLUDING A MAGNETORESISTANCE AMPLIFICATION LAYER

(71) Applicant: WESTERN DIGITAL TECHNOLOGIES, INC., San Jose, CA (US)

(72) Inventors: Goran Mihajlovic, San Jose, CA (US); Lei Wan, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 170 days.

(21) Appl. No.: 17/810,710

(22) Filed: Jul. 5, 2022

(65) Prior Publication Data

US 2024/0016065 A1 Jan. 11, 2024

(51) Int. Cl.
*G11C 11/16* (2006.01)
*H10B 61/00* (2023.01)
*H10N 50/80* (2023.01)
*H10N 50/85* (2023.01)

(52) U.S. Cl.
CPC ............ *H10N 50/80* (2023.02); *G11C 11/161* (2013.01); *G11C 11/1673* (2013.01); *H10B 61/00* (2023.02); *H10N 50/85* (2023.02)

(58) Field of Classification Search
CPC ........ H10N 50/80; H10N 50/85; H10B 61/00; G11C 11/161; G11C 11/1673
USPC .......................................................... 365/211
See application file for complete search history.

(56) References Cited

U.S. PATENT DOCUMENTS

| | | | |
|---|---|---|---|
| 9,853,206 B2 | 12/2017 | Pinarbasi et al. | |
| 10,726,892 B2 | 7/2020 | Le et al. | |
| 10,797,227 B2 | 10/2020 | Le et al. | |
| 10,811,596 B2 | 10/2020 | Le et al. | |
| 10,862,022 B2 | 12/2020 | Le et al. | |
| 10,916,284 B2 | 2/2021 | Le et al. | |
| 10,991,407 B1 | 4/2021 | Prasad et al. | |
| 11,005,034 B1 | 5/2021 | Prasad et al. | |
| 11,056,640 B2 | 7/2021 | Prasad et al. | |
| 11,176,981 B1 | 11/2021 | Prasad et al. | |
| 11,217,289 B1 | 1/2022 | Prasad et al. | |
| 11,309,487 B2 | 4/2022 | Le et al. | |
| 11,361,805 B2 | 6/2022 | Mihajlovic et al. | |

(Continued)

OTHER PUBLICATIONS

Hu, J. et al., "Room-Temperature Colossal Magnetoresistance in Terraced Single-Layer Graphene," Advanced Materials, vol. 32, No. 37, pp. 2002201 (1-9), (2001); DOI:10.1002/adma.202002201.

(Continued)

*Primary Examiner* — Ly D Pham
(74) *Attorney, Agent, or Firm* — THE MARBURY LAW GROUP PLLC

(57) ABSTRACT

A magnetoresistive memory cell includes a first electrode, a second electrode that is spaced from the first electrode, a magnetic tunnel junction layer stack located between the first electrode and the second electrode, the magnetic tunnel junction layer stack containing, from one side to another, a reference layer having a fixed reference magnetization direction, a tunnel barrier layer comprising a dielectric material, and a free layer, and an asymmetric magnetoresistance layer located between the magnetic tunnel junction layer stack and one of the first electrode and the second electrode.

20 Claims, 5 Drawing Sheets

(56) References Cited

U.S. PATENT DOCUMENTS

| | | | |
|---|---|---|---|
| 2006/0183318 A1* | 8/2006 | Liu | H10N 50/01 |
| | | | 257/E27.005 |
| 2009/0231909 A1 | 9/2009 | Dieny et al. | |
| 2013/0215672 A1* | 8/2013 | Zhou | H10N 50/10 |
| | | | 365/158 |
| 2013/0303379 A1 | 11/2013 | Bulzacchelli et al. | |
| 2016/0043307 A1 | 2/2016 | Kioussis et al. | |
| 2020/0035908 A1 | 1/2020 | Ku et al. | |
| 2020/0279991 A1 | 9/2020 | Le et al. | |
| 2020/0350364 A1 | 11/2020 | Wan et al. | |
| 2021/0159392 A1 | 5/2021 | Prasad et al. | |
| 2021/0210676 A1 | 7/2021 | Prasad | |
| 2021/0210677 A1 | 7/2021 | Prasad | |
| 2021/0225421 A1 | 7/2021 | Mihajlovic et al. | |
| 2021/0320245 A1 | 10/2021 | Kalitsov et al. | |
| 2021/0327483 A1 | 10/2021 | Prasad et al. | |
| 2021/0327484 A1 | 10/2021 | Prasad et al. | |
| 2022/0036934 A1 | 2/2022 | Prasad et al. | |
| 2022/0130442 A1 | 4/2022 | Kalitsov et al. | |
| 2022/0131068 A1 | 4/2022 | Kalitsov et al. | |

OTHER PUBLICATIONS

Liu, P. et al., "Planar-Symmetry-Breaking Induced Antisymmetric Magnetoresistance in van der Waals Ferromagnet $Fe_3GeTe_2$," Nano Research, vol. 15, pp. 2531-2536, (2022); DOIhttps://doi.org/10.1007/s12274-021-3826-9.

Seo, J. et al., "Colossal Angular Magnetoresistance in Ferrimagnetic Nodal-Line Semiconductors," Nature, vol. 599, pp. 576-581, (2021); DOIhttps://doi.org/10.1038/s41586-021-04028-7.

Wang, X. et al., "Room Temperature Giant and Linear Magnetoresistance in Topological Insulator $Bi_2Te_3$ Nanosheets," Phys. Rev. Lett., vol. 108, No. 26, 266806, Published Jun. 29, 2012.

U.S. Appl. No. 17/341,049, filed Jun. 7, 2021, Western Digital Technologies Inc.

U.S. Appl. No. 17/341,090, filed Jun. 7, 2021, Western Digital Technologies Inc.

U.S. Appl. No. 17/341,119, filed Jun. 7, 2021, Western Digital Technologies Inc.

\* cited by examiner

MAGNETORESISTIVE MEMORY DEVICE INCLUDING A MAGNETORESISTANCE AMPLIFICATION LAYER

FIELD

The present disclosure relates generally to the field of magnetoresistive memory devices, and specifically to magnetoresistive memory devices including a magnetoresistance amplification layer.

BACKGROUND

A magnetoresistive memory device can store information employing the difference in electrical resistance of a first configuration in which a ferromagnetic free layer has a magnetization direction that is parallel to the magnetization of a ferromagnetic reference layer and a second configuration in which the free layer has a magnetization direction that is antiparallel to the magnetization of the reference layer. Programming of the magnetoresistive memory device requires flipping of the direction of the magnetization of the free layer employing various external power sources, which may be magnetic in nature or may employ a spin transfer mechanism.

One of the main challenges for realization of magnetoresistive memory devices is a small readout signal due to a small tunneling magnetoresistance (TMR) ratio. Generally, TMR decreases strongly with an increase in the sensing bias voltage. As the sensing bias voltage increases, the decrease in the value of TMR is more pronounced for devices with high zero-bias TMR. As a result, even the magnetoresistive devices having a high zero-bias TMR do not provide sufficient improvement in the read signal at typical sensing bias voltages, which may reach about 1.0 V.

Some magnetoresistive random access memory devices are operated in a self-referenced read mode to overcome the problems associated with a small TMR at a readout voltage. However, this operation is slower than desired.

SUMMARY

According to an aspect of the present disclosure, a magnetoresistive memory cell is provided, which comprises: a first electrode; a second electrode that is spaced from the first electrode; a magnetic tunnel junction layer stack located between the first electrode and the second electrode, the magnetic tunnel junction layer stack comprising, from one side to another, a reference layer having a fixed reference magnetization direction; a tunnel barrier layer comprising a dielectric material, and a free layer; and an asymmetric magnetoresistance layer located between the magnetic tunnel junction layer stack and one of the first electrode and the second electrode.

DETAILED DESCRIPTION

Figure 1:
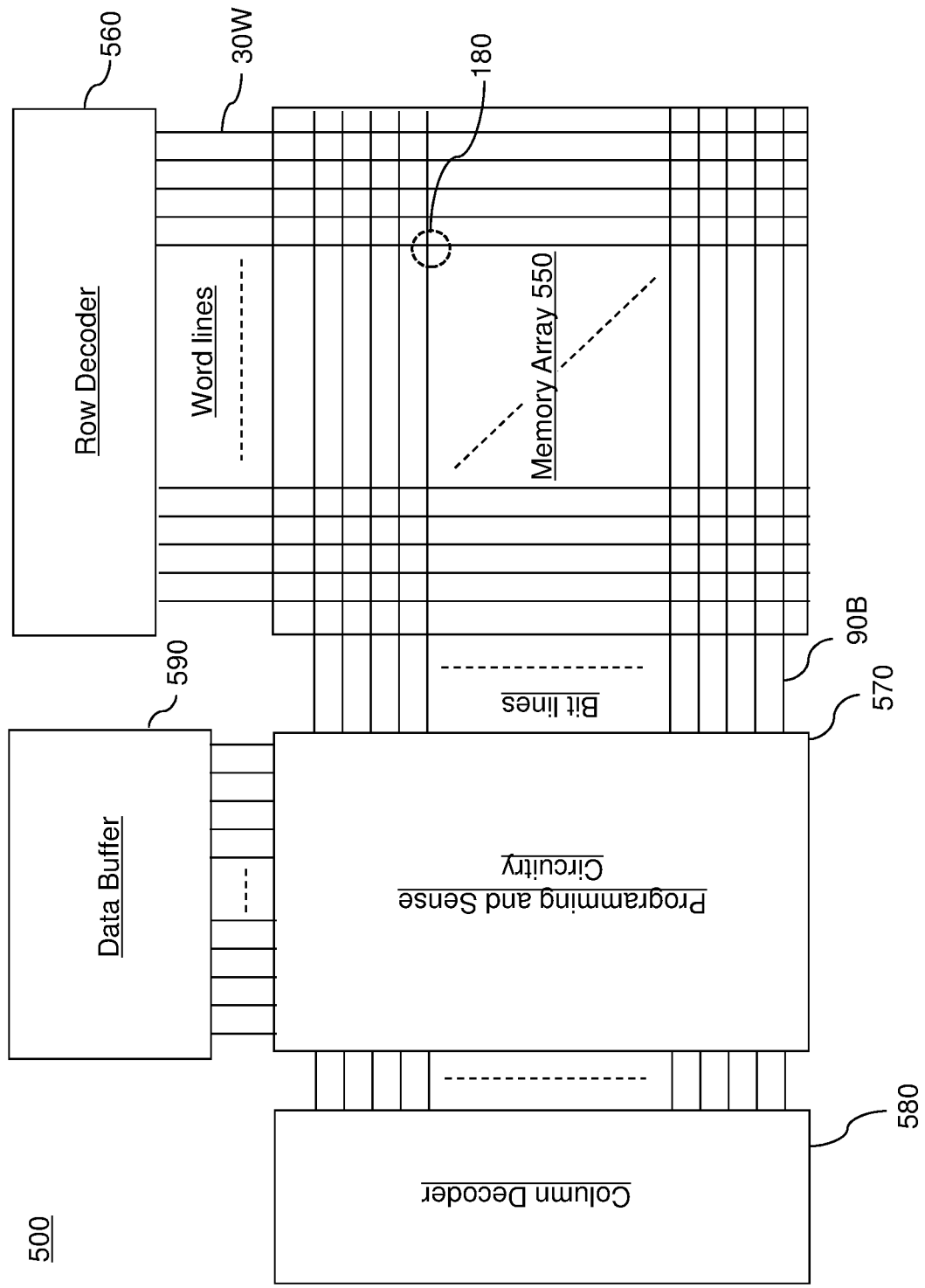
FIG. 1 is a schematic diagram of a random access memory device including magnetoresistive memory cells of the embodiments of the present disclosure in an array configuration.

As discussed above, the embodiments of the present disclosure are directed to magnetoresistive memory devices (e.g., magnetoresistive random access memory ("MRAM")) including a magnetoresistance amplification layer. The magnetoresistance amplification layer is expected to permit utilization of stray field of the ferromagnetic free layer in a MRAM cell in order to amplify the readout signal of the cell. In one embodiment, the magnetoresistance amplification layer comprises a material that can exhibit asymmetric magnetoresistance such that it results in higher value of resistance channel for the stray field corresponding to the antiparallel state of a MRAM cell and lower value of the resistance channel for the stray field corresponding to parallel state of the MRAM cell. Preferably, the magnitude of such magnetoresistance relative to that of the magnetic tunnel junction ("MTJ") is sufficiently high so that it increases the signal-to-noise ratio.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A spin-transfer torque (STT) magnetoresistive memory device comprises a magnetic tunnel junction structure that includes a pinned reference layer and a free layer that are magnetized perpendicularly and are separated by a dielectric tunnel barrier layer. A dielectric capping layer is provided on the free layer on the opposite side of the dielectric tunnel barrier layer in order to provide additional perpendicular anisotropy. The dielectric capping layer is generally very thin so that the resistance due to the dielectric capping layer is negligible compared to the tunnel barrier resistance, which dominates the total resistance of the STT magnetoresistive memory cell.

Information can be stored in the form of the direction of magnetization of the free layer. The direction of the magnetization of the free layer can be parallel or antiparallel to the direction of magnetization of the reference layer, which results in the above described corresponding parallel and antiparallel states of the MRAM cell. Information on the relative direction of the magnetizations can be read by passing smaller electrical current through the magnetic tunnel junction between a top electrode and a bottom electrode, and by measuring the electrical resistance of the memory cell. Stored data bits of "0" and "1" correspond to low and high resistance state of the cell (or vice versa), which are obtained for parallel and antiparallel magnetization orientation of the free layer and the pinned reference layers, respectively.

Some materials exhibit asymmetric magnetoresistance. In an illustrative example, X. Wang, *Room Temperature Giant and Linear magnetoresistance in Topological Insulator $Bi_2Te_3$ Nanosheets*, Physical Review Letters, 108, 266806 (2012) disclose magnetoresistance in a two-dimensional material layer. J. Seo, *Colossal angular magnetoresistance in ferrimagnetic nodal-line semiconductors*, Nature 599, 576-581 (2021) disclose a layered ferrimagnet, $Mn_3Si_2Te_6$, which exhibits large variations of angular magnetoresistance with rotating magnetization. J. Hu, *Room-Temperature Colossal Magnetoresistance in Terraced Single-Layer Graphene*, Advanced Materials, published online at https://doi.org/10.1002/adma.202002201 (2021) discloses room-temperature colossal MR of up to 5000% at 9 T in terraced single-layer graphene. P. Liu, Planar-symmetry-breaking induced antisymmetric magnetoresistance in van der Waals ferromagnetic $Fe_2GeTe_2$, Nano Research, Volume 15, Issue 3, p.2531-2536 (2022) discloses domain-wall-driven asymmetric magnetoresistance.

Generally, MRAM cells of embodiments of the present disclosure include an asymmetric magnetoresistance layer that includes a material that exhibits asymmetric magnetoresistance, i.e., whose electrical resistance increases or decreases depending on the direction of an external magnetic field. According to an aspect of the present disclosure, the material of the asymmetric magnetoresistance layer is oriented in the MRAM cell such that the resistance of the asymmetric magnetoresistance layer is higher when the magnetic tunnel junction (MTJ) layer stack of the MRAM cell is in the antiparallel state (i.e., having an antiparallel alignment of magnetization direction between the reference layer and the free layer), and is lower when the MTJ layer stack of the MRAM cell is in the parallel state (i.e., having a parallel alignment of magnetization direction between the reference layer and the free layer). According to an aspect of the present disclosure, the asymmetric magnetoresistance layer is electrically connected in a series connection with the MTJ layer stack in the same MRAM cell. Thus, the resistance ratio can be magnified between a high resistance antiparallel state of the MRAM cell and a low resistance parallel state of the MRAM cell by incorporating the asymmetric magnetoresistance layer within the MRAM cell.

In one embodiment, the asymmetric magnetoresistance layer may be located between the free layer of the MTJ layer stack and a first one of the two electrodes of the MRAM cell, and the first electrode is laterally offset from the MTJ layer stack. In one embodiment, the asymmetric magnetoresistance layer may comprise a non-magnetic material. The various aspects of the present disclosure are now described in detail with reference to accompanying drawings.

Referring to FIG. 1, a schematic diagram is shown for a magnetoresistive memory device 500 including multiple magnetoresistive memory cells 180 of embodiments of the present disclosure. In one embodiment, the magnetoresistive memory device 500 can be configured as a magnetoresistive random access memory (MRAM) device containing a two-dimensional array or a three-dimensional array of magnetoresistive memory cell 180 of the embodiments of the present disclosure. As used herein, a "random access memory device" refers to a memory device containing memory cells that allow random access, e.g., access to any selected memory cell upon a command for reading the contents of the selected memory cell.

The magnetoresistive memory device 500 can include a memory array region 550 containing an array of the respective magnetoresistive memory cells (e.g., MRAM cells) 180 located at the intersection of the respective word lines 30W and bit lines 90B. The magnetoresistive memory device 500 may also contain a row decoder 560 connected to the word lines 30W, a combination of a programming and sense circuitry 570 (which can include programming transistors, sense amplifiers, and other bit line control circuitry) connected to the bit lines 90B, a column decoder 580 connected to the bit lines 90B through the programming and sense circuitry 570, and a data buffer 590 connected to the programming and sense circuitry 570. Multiple instances of the magnetoresistive memory cells 180 are provided in an array configuration that forms the magnetoresistive memory device 500. As such, each of the magnetoresistive memory cells 180 can be a two-terminal device including a respective first electrode and a respective second electrode. It should be noted that the location and interconnection of elements are schematic and the elements may be arranged in a different configuration. Further, a magnetoresistive memory cell 180 may be manufactured as a discrete device, i.e., a single isolated device.

Figure 2:
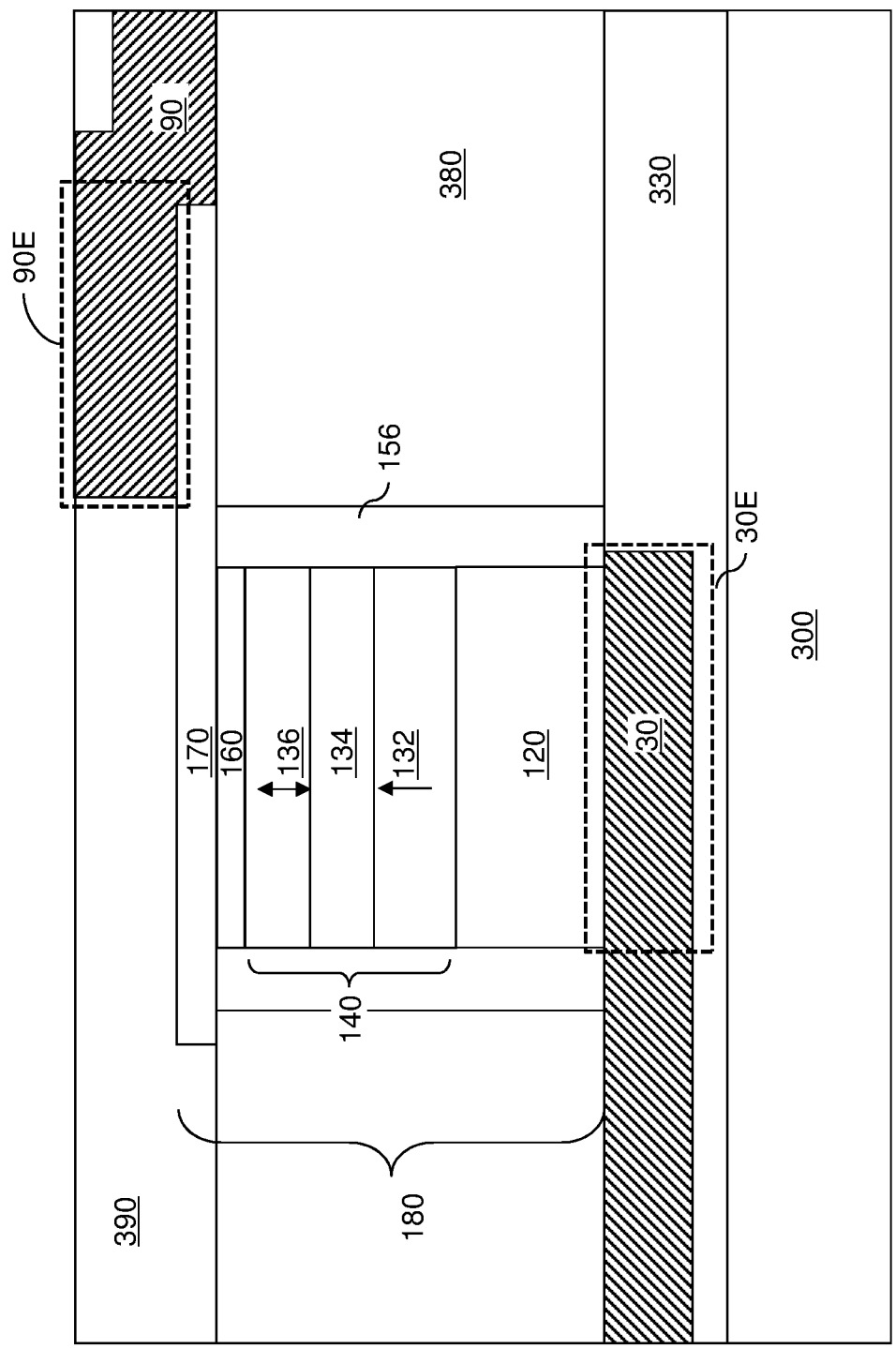
FIG. 2 is a schematic vertical cross-sectional view of a first exemplary structure according to an embodiment of the present disclosure.

Referring to FIG. 2, a first exemplary structure including a first configuration of a magnetoresistive memory cell 180 of the first embodiment of the present disclosure is illustrated. The magnetoresistive memory cell 180 can be formed on or over a substrate 300, which may be a semiconductor substrate, an insulating substrate, a conductive substrate, or a combination thereof. In one embodiment, the substrate 300 may comprise a semiconductor substrate, such as a silicon wafer, and at least one semiconductor device (not shown) such as at least one field effect transistor used as a logic (e.g., driver) transistor can be formed on a top surface of the substrate 300. Optionally, metal interconnect structures (not illustrated) embedded in dielectric material layers (not illustrated) may be formed over the at least one semiconductor device.

At least one first metal line 30 embedded in a first dielectric material layer 330 can be formed over the substrate 300. In one embodiment, the first metal lines 30 may comprise the word lines 30W illustrated in FIG. 1. Alternatively, the first metal lines 30 may comprise the bit lines 90B illustrated in FIG. 1. A portion of the at least one first metal line 30 constitutes a first electrode 30E for a magnetoresistive memory cell 180 to be subsequently formed. It should be noted that while a portion of the first metal line 30 is shown as extending laterally from the patterned layer stack (120, 140, 160) in FIG. 2, the first metal line may extend in and out of the plane of FIG. 2 under the patterned layer stack (120, 140, 160) instead.

At least one patterned layer stack (120, 140, 160) can be formed such that a bottom surface of each patterned layer stack (120, 140, 160) electrically contacts a top surface of a respective first metal line 30. As used herein, top and bottom refer to the relative directions shown in the figures, and do not imply a required orientation of the MRAM cell 180 relative to ground. The MRAM cell 180 may be positioned right side up, upside down, sideways or diagonally relative to the ground. Furthermore, additional intervening layers may be located between the patterned layer stack and the substrate.

In one embodiment, each patterned layer stack (120, 140, 160) may include, from bottom to top, a perpendicular-magnetic-anisotropy-inducing (PMA-inducing) layer 120, a ferromagnetic reference layer 132, a tunnel barrier layer 134, a ferromagnetic free layer 136, and an optional dielectric capping layer 160. The at least one patterned layer stack (120, 140, 160) may comprise a single patterned layer stack (120, 140, 160), a one-dimensional array of patterned layer stacks (120, 140, 160), or a two-dimensional array of patterned layer stacks (120, 140, 160). The at least one patterned layer stack (120, 140, 160) can be formed, for example, by sequentially depositing a stack of continuous material layers, by applying and patterning a photoresist layer or another masking layer over the stack of continuous material layers, and by etching (e.g., ion milling) unmasked portions of the stack of continuous material layers. Generally, at least one anisotropic etch process, at least one isotropic etch process, and/or at least one ion milling process may be employed to pattern the stack of continuous material layers into the at least one patterned layer stack (120, 140, 160).

The PMA-inducing layer 120 is configured to induce perpendicular magnetic anisotropy in the reference layer 132. In other words, the PMA-inducing layer 120 can induce vertical alignment, either along the upward direction or along the downward direction, of the magnetization of the reference layer 132. In one embodiment, the PMA-inducing layer 120 may comprise a superlattice of at least two component layers that are selected to induce perpendicular magnetic anisotropy in an overlying material layer. In one embodiment, the PMA-inducing layer 120 may comprise multiple repetitions of a unit layer stack including a first layer containing a CoFe alloy and a second layer containing platinum, palladium, and/or nickel. Each first layer may have a thickness in a range from 0.2 nm to 1 nm, and each second layer may have a thickness in a range from 0.2 nm to 1 nm. The number of repetitions of the unit layer stack may be in a range from 2 to 20, although a greater number may also be employed. In one embodiment, the PMA-inducing layer 120 may include a superlattice of cobalt layers and platinum layers. Alternatively, the PMA-inducing layer 120 may include an alloy of at least one rare earth element and at least one transition metal. For example, the PMA-inducing layer 120 may include an alloy of gadolinium and at least one transition metal element selected from cobalt and iron. Yet alternatively, the PMA-inducing layer 120 may comprise a combination of one or more ferromagnetic material layers and an antiferromagnetic coupling layer such that the combination of the PMA-inducing layer 120 and the reference layer 132 forms a synthetic antiferromagnet (SAF) structure.

The reference layer 132 can include a Fe layer, a Co layer, a Ni layer, a Co/Ni multilayer structure or a Co/Pt multilayer structure. The reference layer 132 may optionally include a thin non-magnetic layer comprised of tantalum having a thickness of 0.2 nm~0.5 nm and a thin CoFeB layer (having a thickness in a range from 0.5 nm to 3 nm). In one embodiment, the reference layer 132 can comprise, and/or consist of, a first iron layer having a thickness in a range from two atomic layers (i.e., monolayers) of iron to five atomic layers of iron, such as three to four atomic layers of iron. For example, the reference layer 132 can have a thickness of 2 to 10 nm, such as 3 to 6 nm.

The free layer 136 can include a ferromagnetic material such as CoFeB, CoFe, Co, Ni, Fe, NiFe, or a ferromagnetic alloy including at least one of Fe, Co, and Ni (such as CoFeB) at a composition that provides positive uniaxial magnetic anisotropy. In an illustrative example, the free layer 136 comprises a CoFeB layer, and the atomic concentration of boron atoms within the CoFeB alloy may be in a range from 10% to 30% (such as 20%), the atomic concentration of cobalt atoms within the CoFeB alloy may be in a range from 10% to 40% (such as 15%), and the atomic concentration of Fe in the CoFeB layer may be in a range from 50% to 90% (such as 65%). Alternatively, the free layer 136 can include a magnetic Heusler alloy. In one embodiment, the free layer 136 can comprise, and/or consist essentially of, an iron layer having a thickness in a range from two atomic layers of iron to forty atomic layers of iron, such as three to fifteen atomic layers of iron. For example, the free layer 136 can have a thickness of 1 to 10 nm, such as 2 to 6 nm.

The tunnel barrier layer 134 can include any non-magnetic tunnel barrier material, such as an electrically insulating material. Exemplary tunnel barrier materials include magnesium oxide, aluminum oxide, and various spinels. In one embodiment, the tunnel barrier layer 134 comprises and/or consists essentially of magnesium oxide and has a thickness in a range from 0.5 nm to 1.5 nm, such as from 0.8 nm to 1 nm. A stack including the reference layer 132, the tunnel barrier layer 134, and the free layer 136 constitutes the magnetic tunnel junction ("MTJ") layer stack 140.

The dielectric capping layer 160 can include a dielectric material. The material composition and the thickness of the dielectric capping layer 160 are selected such that the dielectric capping layer 160 provides less electrical resistance than the tunnel barrier layer 134. For example, the dielectric capping layer 134 may comprise magnesium oxide, and may have a thickness in a range from 0.2 nm to 1.0 nm, such as from 0.4 nm to 0.8 nm.

In one embodiment, a passivation dielectric material such as silicon nitride, silicon oxynitride, or silicon carbonitride can be deposited over the sidewalls of at least one patterned layer stack (120, 140, 160). An anisotropic etch process can be performed to remove horizontally-extending portions of the passivation dielectric material. Each vertically-extending portion of the passivation dielectric material constitutes an encapsulation dielectric spacer 156 that laterally surrounds a respective patterned layer stack (120, 140, 160). The lateral thickness of each encapsulation dielectric spacer 156, as measured between an inner sidewall and an outer sidewall, may be in a range from 10 nm to 100 nm, although lesser and greater thicknesses may also be employed. In one embodiment, each encapsulation dielectric spacer 156 may have a respective tubular configuration. In another embodiment, the encapsulation dielectric spacer 156 may be omitted.

A dielectric material, such as silicon oxide, may be deposited around the at least one patterned layer stack (120, 140, 160) and the at least one encapsulation dielectric spacer 156 (if present). Portions of the dielectric material overlying the horizontal plane including the top surface(s) of the at least one patterned layer stack (120, 140, 160) can be removed by a planarization process such as a chemical mechanical polishing (CMP) process. The remaining portion of the dielectric material constitutes a memory-level dielectric material layer 380.

According to an aspect of the present disclosure, a material that can provide asymmetric magnetoresistance can be deposited above the top surfaces of the at least one patterned layer stack (120, 140, 160) and the memory-level dielectric material layer 380. The material is herein referred to as an asymmetric magnetoresistance material. A photoresist layer (not shown) can be applied over the layer of the asymmetric magnetoresistance material, and can be lithographically patterned to cover a portion of the layer of the asymmetric magnetoresistance material over each patterned layer stack (120, 140, 160). An etch process can be performed to pattern the layer of the asymmetric magnetoresistance material. Specifically, portions of the layer of the asymmetric magnetoresistance material that are not masked by the photoresist layer can be removed by the etch process. The etch process may comprise an anisotropic etch process and/or an isotropic etch process. Each patterned portion of the layer of the asymmetric magnetoresistance material constitutes an asymmetric magnetoresistance layer 170. The photoresist layer can be removed, for example, by ashing.

According to an embodiment of the present disclosure, each asymmetric magnetoresistance layer 170 may contact the entirety of the topmost surface of a respective patterned layer stack (120, 140, 160). For example, each asymmetric magnetoresistance layer 170 may contact the entirety of the top surface of the dielectric capping layer 160 of a respective patterned layer stack (120, 140, 160). In one embodiment, the asymmetric magnetoresistance layer 170 may contact the entirety of the top surface of a respective encapsulation dielectric spacer 156 (if present).

According to an aspect of the present disclosure, each asymmetric magnetoresistance layer 170 may comprise a first portion that has an areal overlap with a respective underlying patterned layer stack (120, 140, 160) (i.e., which overlaps with the MTJ layer stack 140) and a second portion that does not have an areal overlap with the respective underlying patterned layer stack (120, 140, 160) or an underlying encapsulation dielectric spacer 156. In other words, each asymmetric magnetoresistance layer 170 may comprise a laterally-extending portion that does not have an overlay with an underlying patterned layer stack (120, 140, 160) (i.e., which does not overlap the MTJ layer stack 140).

Generally, the asymmetric magnetoresistance layer 170 includes a material that can provide different resistance as a function a stray magnetic field from the magnetic tunnel junction layer stack 140. In one embodiment, the asymmetric magnetoresistance layer 170 can be more proximal to the free layer 136 than to the reference layer 132 to increase the susceptibility to the change of the stray magnetic field caused by a change in the direction of magnetization of the free layer 136. In one embodiment, the asymmetric magnetoresistance layer 170 may have a greater lateral extent than the magnetic tunnel junction layer stack to increase the volume of the asymmetric magnetoresistance material that interacts with the stray magnetic field from the magnetic tunnel junction layer stack 140.

According to an aspect of the present disclosure, the asymmetric magnetoresistance layer 170 may comprise and/or may consist essentially of a two-dimensional material exhibiting asymmetric magnetoresistance. For example, the asymmetric magnetoresistance layer 170 comprises a material selected from a transition-metal dichalcogenide (e.g., metal sulfide or metal selenide) monolayer, a monolayer of graphene, a multilayer graphene stack, or a gapped bilayer graphene.

In one embodiment, the asymmetric magnetoresistance layer 170 comprises a material that provides magnetoresistance that increases with a magnitude of an externally applied magnetic field. In one embodiment, the asymmetric magnetoresistance layer 170 has a homogeneous material composition throughout. In other words, the asymmetric magnetoresistance layer 170 includes a single material, and does not include a stack of two different materials. The total thickness of the asymmetric magnetoresistance layer 170 is the thickness of the two-dimensional asymmetric magnetoresistance material, and as such, may be in a range from 0.3 nm to 2 nm.

A transition-metal dichalcogenide monolayer is an atomically thin semiconductor material having a material composition of $MX_n$, in which M is a transition-metal atom such as Mo, W, Ti, Nb etc., and X is a chalcogen atom such as S, Se, or Te, and n is a number, such as 2. One layer of the transition-metal atom may be located between two layers of the chalcogen atoms. A transition-metal dichalcogenide monolayer exhibits two-dimensional electron transport characteristics and magnetic properties. For example, $WTe_2$ exhibits anomalous giant magnetoresistance and superconductivity.

A gapped bilayer graphene refers to a structure in which two graphene sheets are stacked in a manner that forms a gap in a band structure, thereby enabling a two-dimensional electron confinement therein. For example, a type of gapped bilayer graphene comprises an AB-bilayer graphene. The band gap may be induced by applying an external electric field to the AB-bilayer graphene, or may be induced by using dielectric materials like hexagonal boron nitride (h-BN) or silicon carbide (SiC). A suitable band gap in a gapped bilayer graphene may induce band-gap-induced magnetic properties.

Generally, a monolayer graphene or a multilayer graphene stack may be suitably doped to modify the band gap structure and to tailor its properties.

Alternatively, the asymmetric magnetoresistance layer 170 comprises a topological insulator material having an insulating interior portion and having surfaces containing conducting states. A topological insulator is a material that includes an interior that functions as an insulator and includes surface containing conducting states. Thus, electrons can move along the surfaces of the topological insulator material. In a topological insulator material, surface states are symmetry-protected Dirac fermions by particle number conservation and time-reversal symmetry. As such, the surface states function in a similar manner as a conventional electron gas subject to a strong external magnetic field. Thus, electronic excitation gap is present in the interior, and metallic conduction occurs at the boundaries or surfaces, thereby providing suitable magnetic properties.

According to an aspect of the present disclosure, the asymmetric magnetoresistance layer 170 has a first layer magnetoresistance when a magnetization of the reference layer 132 and a magnetization of the free layer 136 are in a parallel state, and the asymmetric magnetoresistance layer 170 has a second layer magnetoresistance when the magnetization of the free layer 136 and the magnetization of the free layer 136 are in an antiparallel state. In one embodiment, the ratio of the second layer magnetoresistance to the first layer magnetoresistance is least 1.1, and/or at least 1.5, and/or at least 2 and/or at least 5, and/or at least 10, and/or at least 30, such as 1.1 to 50, for example, 1.5 to 30, including 2 to 10.

In one embodiment, the magnetic tunnel junction layer stack 140 has a first junction magnetoresistance when the magnetization of the free layer 136 and the magnetization of the reference layer 132 are in the parallel state. The magnetic tunnel junction layer stack 140 has a second junction magnetoresistance when the magnetization of the free layer 136 and the magnetization of the reference layer 132 are in the antiparallel state. In one embodiment, the ratio of the second layer magnetoresistance to the first layer magnetoresistance (i.e., the magnetoresistance ratio of layer 170) may be greater than the ratio of the second junction magnetoresistance to the first junction magnetoresistance (i.e., the magnetoresistance ratio of the MTJ layer stack 140).

The combination of a asymmetric magnetoresistance layer 170 and a patterned layer stack (120, 140, 160) including a PMA-inducing layer 120, a magnetic tunnel junction layer stack 140, and a dielectric capping layer 160 constitutes a magnetoresistive memory cell (i.e., MRAM cell) 180.

At least one second metal line 90 embedded in a second dielectric material layer 390 can be formed over the asymmetric magnetoresistance layer 170. In one embodiment, the second metal lines 90 may be formed as bit lines 90B illustrated in FIG. 1. Alternatively, the second metal lines 90 may be formed as word lines 30W illustrated in FIG. 1. A portion of the at least one second metal line 90 constitutes a second electrode for the magnetoresistive memory cell 180. It should be noted that while a portion of the second metal line 90 is shown as extending laterally from the patterned layer stack (120, 140, 160) in FIG. 2, the first metal line may extend in and out of the plane of FIG. 2 over the patterned layer stack (120, 140, 160) instead.

In one embodiment, the asymmetric magnetoresistance layer 170 is in direct contact with a horizontal surface of the second electrode (which may comprise a portion of a second metal line 90). In one embodiment, the asymmetric magnetoresistance layer 170 overlies the magnetic tunnel junction layer stack 140 and contacts a bottom surface of the second electrode (which may comprise a portion of a second metal line 90). In one embodiment, the second electrode (which may comprise a portion of a second metal line 90) is laterally offset from the magnetic tunnel junction layer stack 140 such that the second electrode does not have an areal overlap with the magnetic tunnel junction layer stack 140. This configuration forces the electrical current passing through the magnetic tunnel junction layer stack 140 to pass through a volume in which the stray magnetic field from the magnetic tunnel junction layer stack 140 includes a lateral component, thereby increasing the asymmetric magnetoresistance effect. A dielectric capping layer 160 may contact the free layer 136 and the asymmetric magnetoresistance layer 170. Thus, the magnetoresistance layer 170 is located between the free layer 136 and the second electrode. The dielectric capping layer 160 is located between the free layer 136 and the magnetoresistance layer 170.

Figure 3:
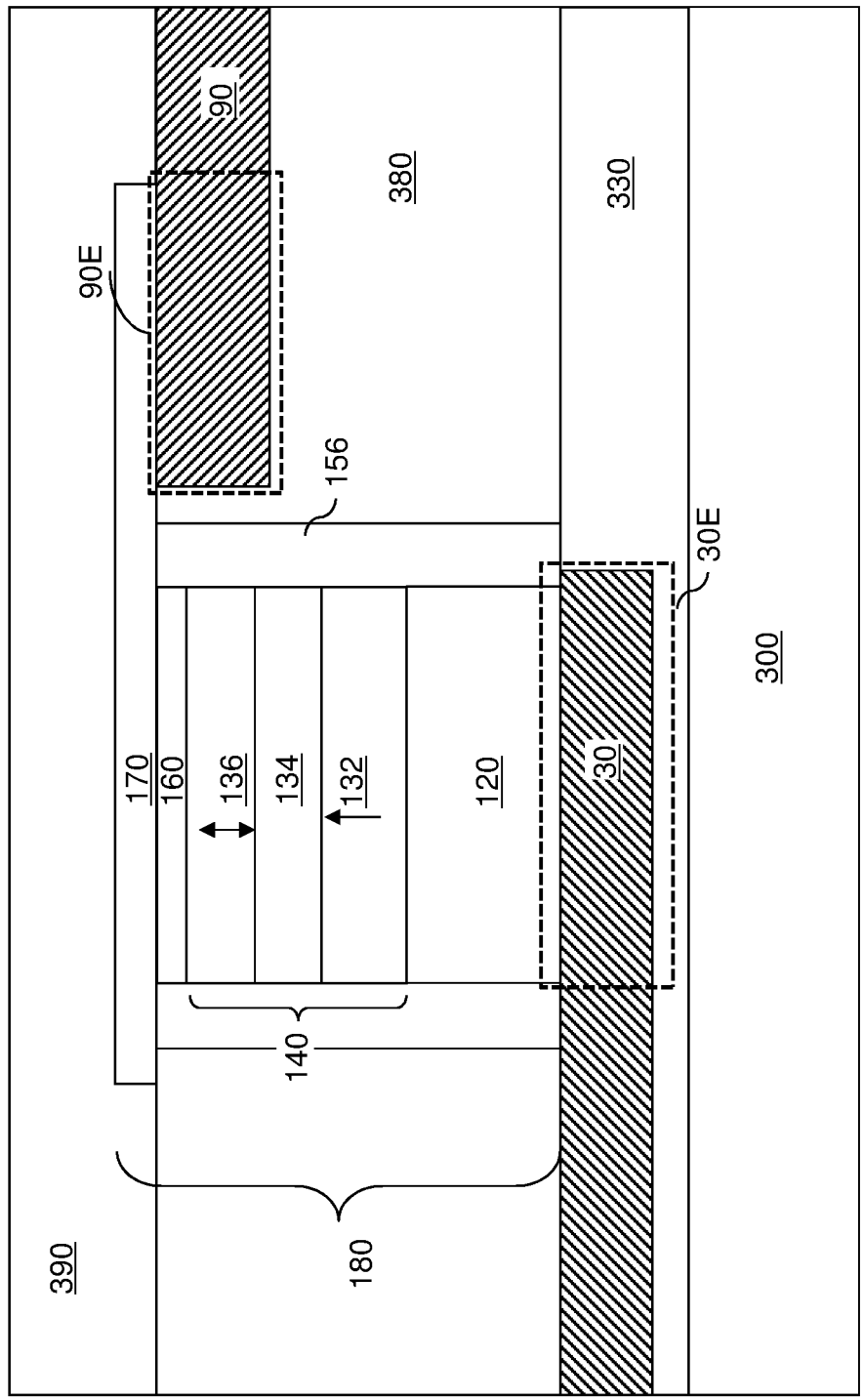
FIG. 3 is a schematic vertical cross-sectional view of a second exemplary structure according to an embodiment of the present disclosure.

Referring to FIG. 3, a second exemplary structure including a second configuration of a magnetoresistive memory cell 180 of the present disclosure is illustrated. The second exemplary structure can be derived from the first exemplary structure of FIG. 2 by forming the at least one second metal line 90 in an upper portion of the memory-level dielectric material layer 380. In this case, at least one line cavity can be formed in an upper portion of the memory-level dielectric material layer 380, and at least one metallic material can be deposited in the at least one line cavity. The at least one metallic material can be removed from above the horizontal plane including the top surface of the memory-level dielectric material layer 380. Each remaining portion of the at least one metallic material that fills a respective line cavity constitutes a second metal line 90. A portion of a second metal line 90 constitutes a second electrode for the magnetoresistive memory cell 180. Alternatively, instead of using a damascene process to form the second electrode 90E, the second electrode 90E may be formed first over a lower portion of the memory-level dielectric material layer 380, followed by forming the upper portion of the memory-level dielectric material layer 380 around the second electrode 90E.

In one embodiment, the asymmetric magnetoresistance layer 170 is in direct contact with a horizontal surface of the second electrode 90E (which may comprise a portion of a second metal line 90). In one embodiment, the asymmetric magnetoresistance layer 170 overlies the magnetic tunnel junction layer stack 140 and contacts a top surface of the second electrode 90E (which may comprise a portion of a second metal line 90). In one embodiment, the second electrode 90E (which may comprise a portion of a second metal line 90) is laterally offset from the magnetic tunnel junction layer stack 140 such that the second electrode 90E does not have an areal overlap with the magnetic tunnel junction layer stack 140. This configuration forces the electrical current passing through the magnetic tunnel junction layer stack 140 to pass through a volume in which the stray magnetic field from the magnetic tunnel junction layer stack 140 includes a lateral component, thereby increasing the asymmetric magnetoresistance effect. A dielectric capping layer 160 may contact the free layer 136 and the asymmetric magnetoresistance layer 170.

In an alternative embodiment, the at least one second metal line 90 can be formed over the top surface of the memory-level dielectric material layer 380. In this case, the asymmetric magnetoresistance layer 170 can include a first horizontally-extending portion that contacts a dielectric capping layer 160, a vertically-extending portion that contacts a sidewall of a second metal line 90, and a second horizontally-extending portion that contacts a top surface of the second metal line 90.

Figure 4:
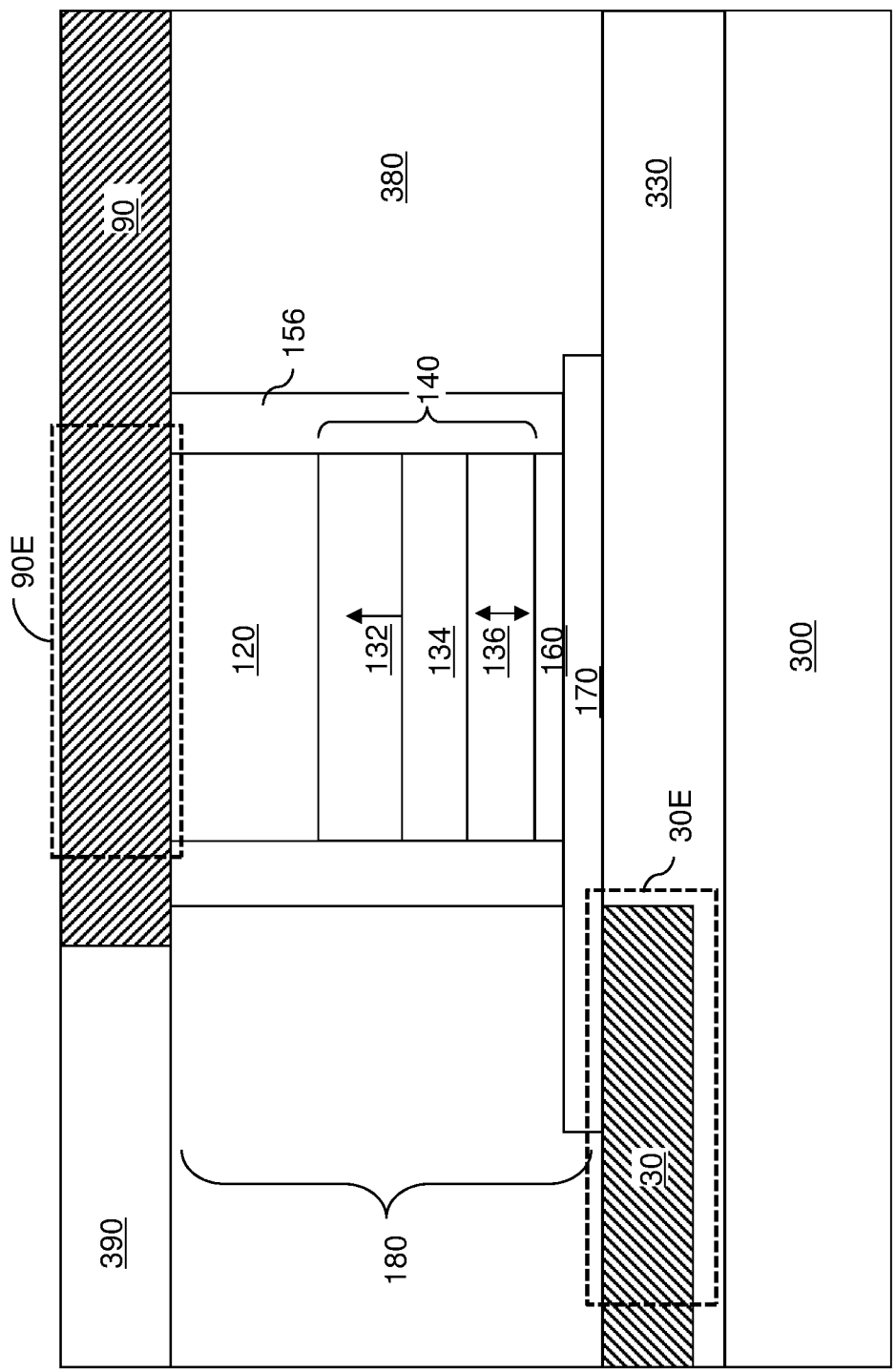
FIG. 4 is a schematic vertical cross-sectional view of a third exemplary structure according to an embodiment of the present disclosure.

Referring to FIG. 4, a third exemplary structure including a third configuration of a magnetoresistive memory cell 180 of the present disclosure is illustrated. The third exemplary structure can be derived from the first exemplary structure of FIG. 2 by forming the asymmetric magnetoresistance layer 170 below the patterned layer stack (120, 140, 160). Thus, the asymmetric magnetoresistance layer 170 may be formed over or directly on a top surface of a first metal line 30. Subsequently, at least one patterned layer stack (120, 140, 160) including the PMA-inducing layer 120, the magnetic tunnel junction layer stack 140, and the dielectric capping layer 160 can be formed. The dielectric capping layer 160 of each patterned layer stack (120, 140, 160) is located over or directly contacts a first portion of the asymmetric magnetoresistance layer 170, and a second portion of the anisotropic magnetoresistance layer 170 does not have an areal overlap with the respective patterned layer stack (120, 140, 160), and contacts a top surface of a respective first electrode 30E, which can comprise a portion of a first metal line 30. In this embodiment, the dielectric capping layer 160 is located below and may be formed prior the MTJ layer stack 140, while the PMA-inducing layer 120 is located above and may be formed after the MTJ layer stack 140.

The optional encapsulation dielectric spacer 156 can be formed around each patterned layer stack (120, 140, 160). A memory-level dielectric material layer 380 can be subsequently formed around the patterned layer stacks (120, 140, 160). At least one second metal line 90 embedded in a second dielectric layer 390 can be formed over the at least one patterned layer stacks (120, 140, 160) and the memory-level dielectric material layer 380.

In one embodiment, the asymmetric magnetoresistance layer 170 may be in direct contact with a horizontal surface of the first electrode 30E (which may comprise a portion of a first metal line 30). In one embodiment, the asymmetric magnetoresistance layer 170 underlies the magnetic tunnel junction layer stack 140 and overlies and optionally contacts a top surface of the first electrode 30E (which may comprise a portion of a first metal line 30). In one embodiment, the first electrode 30E (which may comprise a portion of a first metal line 30) is laterally offset from the magnetic tunnel junction layer stack 140 such that the first electrode 30E does not have an areal overlap with the magnetic tunnel junction layer stack 140. This configuration forces the electrical current passing through the magnetic tunnel junction layer stack 140 to pass through a volume in which the stray magnetic field from the magnetic tunnel junction layer stack 140 includes a lateral component, thereby increasing the asymmetric magnetoresistance effect. A dielectric capping layer 160 may contact the free layer 136 and the asymmetric magnetoresistance layer 170.

Figure 5:
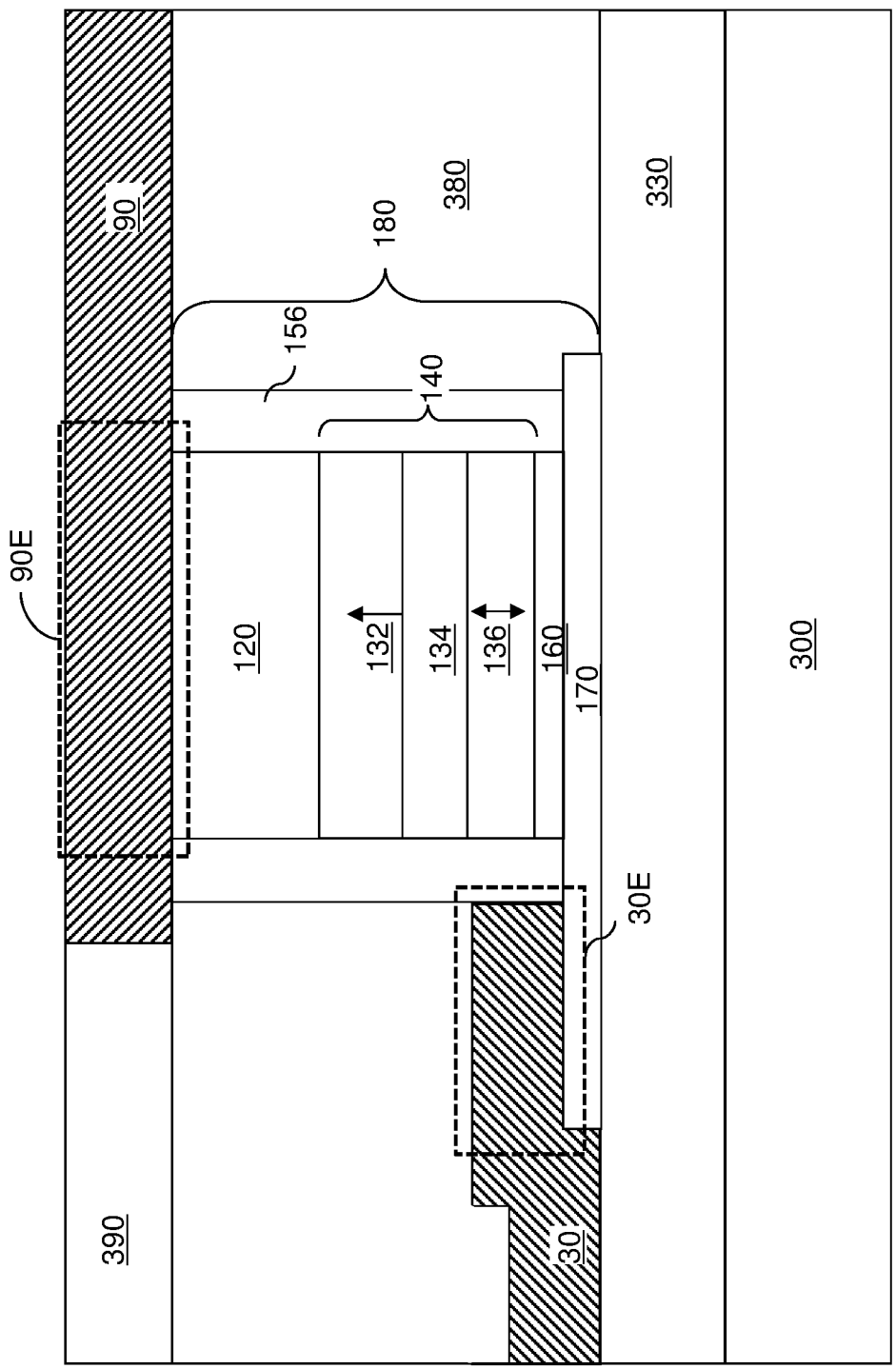
FIG. 5 is a schematic vertical cross-sectional view of a fourth exemplary structure according to an embodiment of the present disclosure.

Referring to FIG. 5, a fourth exemplary structure including a fourth configuration of a magnetoresistive memory cell 180 of the present disclosure is illustrated. The fourth exemplary structure can be derived from the third exemplary structure of FIG. 4 by forming the at least one first metal line 30 over or directly on a portion of a top surface of an asymmetric magnetoresistance layer 170. In this case, the at least one first metal line 30 can be formed after formation of the encapsulation dielectric spacer(s) 156, and prior to formation of the memory-level dielectric material layer 380.

In one embodiment, the asymmetric magnetoresistance layer 170 is in direct contact with a horizontal surface of the first electrode 30E (which may comprise a portion of a first metal line 30). In one embodiment, the asymmetric magnetoresistance layer 170 underlies the magnetic tunnel junction layer stack 140 and contacts a bottom surface of the first electrode 30E (which may comprise a portion of a first metal line 30). In one embodiment, the first electrode 30E (which may comprise a portion of a first metal line 30) is laterally offset from the magnetic tunnel junction layer stack 140 such that the first electrode 30E does not have an areal overlap with the magnetic tunnel junction layer stack 140. This configuration forces the electrical current passing through the magnetic tunnel junction layer stack 140 to pass through a volume in which the stray magnetic field from the magnetic tunnel junction layer stack 140 includes a lateral component, thereby increasing the asymmetric magnetoresistance effect. A dielectric capping layer 160 may contact the free layer 136 and the asymmetric magnetoresistance layer 170.

Referring collectively to all drawings of the instant application and according to various embodiments of the present disclosure, a magnetoresistive memory device is provided, which comprises: a first electrode 30E; a second electrode 90E that is spaced from the first electrode 30E; a magnetic tunnel junction layer stack 140 located between the first electrode 30E and the second electrode 90E, the magnetic tunnel junction layer stack 140 comprising, from one side to another, a reference layer 132 having a fixed reference magnetization direction; a tunnel barrier layer 134 comprising a dielectric material, and a free layer 136; and an asymmetric magnetoresistance layer 170 providing located between the magnetic tunnel junction layer stack 140 and one of the first electrode 30E and the second electrode 90E.

In one embodiment, the asymmetric magnetoresistance layer 170 is more proximal to the free layer 136 than to the reference layer 132.

In one embodiment, the asymmetric magnetoresistance layer 170 is in direct contact with a horizontal surface of the first electrode 30E or the second electrode 90E. In one embodiment, the asymmetric magnetoresistance layer 170 is located between the free layer 136 and the second electrode 90E; the asymmetric magnetoresistance layer 170 has a greater lateral extent than the magnetic tunnel junction layer stack 140; and the second electrode 90E is laterally offset from the magnetic tunnel junction layer stack 140 such that the second electrode 90E does not have an areal overlap with the magnetic tunnel junction layer stack 140.

In one embodiment, the magnetoresistive memory device further comprises a dielectric capping layer 160 located between the free layer 136 and the asymmetric magnetoresistance layer 170.

In one embodiment, the asymmetric magnetoresistance layer 170 has a first layer magnetoresistance when a magnetization of the reference layer 132 and a magnetization of the free layer 136 are in a parallel state; the asymmetric magnetoresistance layer 170 has a second layer magnetoresistance when the magnetization of the reference layer 132 and the magnetization of the free layer 136 are in an antiparallel state; and a ratio of the second layer magnetoresistance to the first layer magnetoresistance is least 1.10.

In one embodiment, the magnetic tunnel junction layer stack 140 has a first junction magnetoresistance when the magnetization of the reference layer 132 and the magnetization of the free layer 136 are in the parallel state; and the magnetic tunnel junction layer stack 140 has a second junction magnetoresistance when the magnetization of the reference layer 132 and the magnetization of the free layer 136 are in the antiparallel state. The second junction magnetoresistance is higher than the first junction magnetoresistance. In one embodiment, the ratio of the second layer magnetoresistance to the first layer magnetoresistance is greater than the ratio of the second junction magnetoresistance to the first junction magnetoresistance.

In one embodiment, the magnetoresistive memory cell utilizes a stray field of the free layer 136 coupled to the asymmetric magnetoresistance layer 170 to amplify a difference in read current between the parallel state and the antiparallel state. In one embodiment, the asymmetric magnetoresistance layer is non-magnetic.

In one embodiment, the asymmetric magnetoresistance layer 170 overlies the magnetic tunnel junction layer stack 140 and contacts a bottom surface of the second electrode 90E.

In one embodiment, the asymmetric magnetoresistance layer 170 overlies the magnetic tunnel junction layer stack 140 and contacts a top surface of the second electrode 90E.

In one embodiment, the asymmetric magnetoresistance layer 170 underlies the magnetic tunnel junction layer stack 140 and contacts a top surface of the first electrode 30E In one embodiment, the asymmetric magnetoresistance layer 170 underlies the magnetic tunnel junction layer stack 140 and contacts a bottom surface of the first electrode 30E.

In one embodiment, the asymmetric magnetoresistance layer 170 comprises a two-dimensional material, which may be selected from a transition-metal dichalcogenide monolayer, a monolayer graphene, multilayer graphene, or a gapped bilayer graphene.

In another embodiment, the asymmetric magnetoresistance layer 170 comprises a topological insulator material having an insulating interior portion and having surfaces containing conducting states.

In one embodiment, a method of reading the magnetoresistive memory cell 180 includes applying a read voltage between the first electrode and the second electrode; and detecting a read current flowing through the magnetic tunnel junction layer stack between the first electrode and the second electrode. The read voltage preferably has a lower magnitude than a programming voltage used to switch the magnetization direction of the free layer to program the cell 180. The magnetoresistive memory cell utilizes a stray field of the free layer coupled to the asymmetric magnetoresistance layer to amplify a difference in the read current between the parallel state and the antiparallel state.

A memory device 500 includes a first metal line 30W laterally extending along a first direction; a second metal line 90B laterally extending along a second direction; and the magnetoresistive memory cell 180 located at a crosspoint of the first metal line and the second metal line. The first electrode 30E comprises a portion of the first metal line; and the second electrode 90E comprises a portion of a second metal line.

In one embodiment, the asymmetric magnetoresistance layer 170 does not assist in switching of the magnetization direction of the free layer 136 during application of the programming voltage between the first and the second electrodes. As such, the magnetoresistive memory cell 180 of the embodiments of the present disclosure is resistant to read-disturb, and provides high-fidelity data retention. The asymmetric magnetoresistance layer 170 is positioned in the vicinity of the free layer 136, and provides amplification of the read signal and improves the signal to noise ration without disturbing the magnetic state of the magnetoresistive memory cell 180 via spin orbit torque.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetoresistive memory cell, comprising:
a first electrode;
a second electrode that is spaced from the first electrode;
a magnetic tunnel junction layer stack located between the first electrode and the second electrode, the magnetic tunnel junction layer stack comprising, from one side to another, a reference layer having a fixed reference magnetization direction; a tunnel barrier layer comprising a dielectric material, and a free layer; and
an asymmetric magnetoresistance layer located between the magnetic tunnel junction layer stack and one of the first electrode and the second electrode.

2. The magnetoresistive memory cell of claim 1, wherein the asymmetric magnetoresistance layer is more proximal to the free layer than to the reference layer.

3. The magnetoresistive memory cell of claim 1, wherein the asymmetric magnetoresistance layer is in direct contact with a horizontal surface of the first electrode or the second electrode.

4. The magnetoresistive memory cell of claim 1, wherein:
the asymmetric magnetoresistance layer is located between the free layer and the second electrode;
the asymmetric magnetoresistance layer has a greater lateral extent than the magnetic tunnel junction layer stack; and
the second electrode is laterally offset from the magnetic tunnel junction layer stack such that the second electrode does not have an areal overlap with the magnetic tunnel junction layer stack.

5. The magnetoresistive memory cell of claim 4, further comprising a dielectric capping layer located between the free layer and the asymmetric magnetoresistance layer.

6. The magnetoresistive memory cell of claim 1, wherein:
the asymmetric magnetoresistance layer has a first layer magnetoresistance when a magnetization of the reference layer and a magnetization of the free layer are in a parallel state;
the asymmetric magnetoresistance layer has a second layer magnetoresistance when the magnetization of the reference layer and the magnetization of the free layer are in an antiparallel state; and
a ratio of the second layer magnetoresistance to the first layer magnetoresistance is at least 1.10.

7. The magnetoresistive memory cell of claim 6, wherein:
the magnetic tunnel junction layer stack has a first junction magnetoresistance when the magnetization of the reference layer and the magnetization of the free layer are in the parallel state; and
the magnetic tunnel junction layer stack has a second junction magnetoresistance when the magnetization of the reference layer and the magnetization of the free layer are in the antiparallel state; and
the second junction magnetoresistance is higher than the first junction magnetoresistance.

8. The magnetoresistive memory cell of claim 7, wherein the ratio of the second layer magnetoresistance to the first layer magnetoresistance is greater than the ratio of the second junction magnetoresistance to the first junction magnetoresistance.

9. The magnetoresistive memory cell of claim 6, wherein magnetroresistive memory cell utilizes a stray field of the free layer coupled to the asymmetric magnetoresistance layer to amplify a difference in read current between the parallel state and the antiparallel state.

10. The magnetoresistive memory cell of claim 9, wherein the asymmetric magnetoresistance layer is non-magnetic.

11. The magnetoresistive memory cell of claim 1, wherein the asymmetric magnetoresistance layer overlies the magnetic tunnel junction layer stack and contacts a bottom surface of the second electrode.

12. The magnetoresistive memory cell of claim 1, wherein the asymmetric magnetoresistance layer overlies the magnetic tunnel junction layer stack and contacts a top surface of the second electrode.

13. The magnetoresistive memory cell of claim 1, wherein the asymmetric magnetoresistance layer underlies the magnetic tunnel junction layer stack and contacts a top surface of the first electrode.

14. The magnetoresistive memory cell of claim 1, wherein the asymmetric magnetoresistance layer underlies the magnetic tunnel junction layer stack and contacts a bottom surface of the first electrode.

15. The magnetoresistive memory cell of claim 1, wherein the asymmetric magnetoresistance layer comprises a two-dimensional material.

16. The magnetoresistive memory cell of claim 15, wherein the two-dimensional material is selected from a transition-metal dichalcogenide monolayer, a monolayer graphene, multilayer graphene, or a gapped bilayer graphene.

17. The magnetoresistive memory cell of claim 1, wherein the asymmetric magnetoresistance layer comprises a topological insulator material having an insulating interior portion and having surfaces containing conducting states.

18. A method of reading the magnetoresistive memory cell of claim 1, comprising:
    applying a read voltage between the first electrode and the second electrode; and
    detecting a read current flowing through the magnetic tunnel junction layer stack between the first electrode and the second electrode,
wherein:
the asymmetric magnetoresistance layer has a first layer magnetoresistance when a magnetization of the reference layer and a magnetization of the free layer are in a parallel state;
the asymmetric magnetoresistance layer has a second layer magnetoresistance when the magnetization of the reference layer and the magnetization of the free layer are in an antiparallel state;
a ratio of the second layer magnetoresistance to the first layer magnetoresistance is at least 1.10; and
the magnetoresistive memory cell utilizes a stray field of the free layer coupled to the asymmetric magnetoresistance layer to amplify a difference in the read current between the parallel state and the antiparallel state.

19. A memory device, comprising:
a first metal line laterally extending along a first direction;
a second metal line laterally extending along a second direction; and
the magnetoresistive memory cell of claim 1 located at a cross-point of the first metal line and the second metal line.

20. The memory device of claim 19, wherein:
the first electrode comprises a portion of the first metal line; and
the second electrode comprises a portion of a second metal line.

* * * * *